US007057265B2

(12) United States Patent
Takeda et al.

(10) Patent No.: US 7,057,265 B2
(45) **Date of Patent: *Jun. 6, 2006**

(54) SEMICONDUCTOR DEVICE AND PROCESS FOR FABRICATION THEREOF

(75) Inventors: Shinji Takeda, Tsukuba (JP); Takashi Masuko, Tsukuba (JP); Masami Yusa, Shimodate (JP); Tooru Kikuchi, Hitachi (JP); Yasuo Miyadera, Tsukuba (JP); Iwao Maekawa, Hitachi (JP); Mitsuo Yamasaki, Takahagi (JP); Akira Kageyama, Niiza (JP); Aizou Kaneda, Yokohama (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/428,126

(22) Filed: May 2, 2003

(65) Prior Publication Data

US 2003/0160337 A1 Aug. 28, 2003

Related U.S. Application Data

(63) Continuation of application No. 09/543,247, filed on Apr. 5, 2000, now abandoned, which is a continuation of application No. 08/981,702, filed as application No. PCT/JP96/01886 on Jul. 8, 1996, now abandoned.

(30) Foreign Application Priority Data

Jul. 6, 1995 (JP) .................................. 7-171154

(51) Int. Cl.
*H01L 23/495* (2006.01)
*H01L 29/40* (2006.01)

(52) U.S. Cl. ....................... 257/666; 257/676; 257/783

(58) Field of Classification Search ..................... None
See application file for complete search history.

(56) References Cited

U.S. PATENT DOCUMENTS

| | | | |
|---|---|---|---|
| 3,608,054 | A | 9/1971 | Alvino et al. |
| 4,358,581 | A | 11/1982 | Sutton, Jr. |
| 4,460,718 | A | 7/1984 | Tanaka et al. |
| 4,543,295 | A | 9/1985 | St. Clair et al. |
| 4,581,096 | A | 4/1986 | Sato |
| 4,604,230 | A | 8/1986 | Goswami et al. |
| 4,656,238 | A | 4/1987 | Kunimune et al. |
| 4,681,928 | A | 7/1987 | Berger et al. |

(Continued)

FOREIGN PATENT DOCUMENTS

EP 0271736 A1 6/1988

(Continued)

OTHER PUBLICATIONS

Bynel Adhesive Resin—Series 1100 Including 1123, 1124 and 11E573 Modified Ethylene Vinyl Acetate, 1997-2003, www.dupont.com.

(Continued)

*Primary Examiner*—David E. Graybill
(74) *Attorney, Agent, or Firm*—Griffin & Szipl, P.C.

(57) ABSTRACT

A semiconductor chip is attached to a lead frame with a filmy organic die-bonding material having a water absorption of 1.5% by volume or less; having a saturation moisture absorption of 1.0% by volume or less, having a residual volatile component in an amount not more than 3.0% by weight, having a modulus of elasticity of 10 MPa or less at a temperature of 250° C. The semiconductor device thus obtained can be free from occurrence of reflow cracks during reflow soldering for the packaging of semiconductor devices.

13 Claims, 2 Drawing Sheets

3 2 1

8

8 9 6 1 5

U.S. PATENT DOCUMENTS

| | | | | |
|---|---|---|---|---|
| 4,755,415 | A | 7/1988 | Iijima et al. | |
| 4,875,279 | A | 10/1989 | Sakiadis | |
| 4,933,219 | A | 6/1990 | Sakumoto et al. | |
| 4,965,331 | A | 10/1990 | Jackson et al. | |
| 4,985,105 | A | 1/1991 | Masuda | |
| 4,990,292 | A | 2/1991 | Hattori et al. | |
| 5,115,089 | A | 5/1992 | Yoshida et al. | |
| 5,118,567 | A * | 6/1992 | Komiyama et al. | 428/345 |
| 5,141,050 | A | 8/1992 | Schuft | |
| 5,145,099 | A | 9/1992 | Wood et al. | |
| 5,177,032 | A | 1/1993 | Fogal et al. | |
| 5,204,399 | A | 4/1993 | Edelman | |
| 5,234,522 | A | 8/1993 | Suzuki et al. | |
| 5,238,730 | A | 8/1993 | Hanawa et al. | |
| 5,250,637 | A | 10/1993 | Shiobara et al. | |
| 5,277,972 | A | 1/1994 | Sakumoto et al. | |
| 5,296,074 | A | 3/1994 | Graham et al. | |
| 5,296,567 | A | 3/1994 | Baumann et al. | |
| 5,319,005 | A | 6/1994 | Hagiwara et al. | |
| 5,360,942 | A | 11/1994 | Hoffman et al. | |
| 5,406,124 | A | 4/1995 | Morita et al. | |
| 5,432,380 | A | 7/1995 | Jin et al. | |
| 5,476,908 | A | 12/1995 | Kishi et al. | |
| 5,512,628 | A | 4/1996 | Sakumoto et al. | |
| 5,528,075 | A | 6/1996 | Burns | |
| 5,605,763 | A | 2/1997 | Yusa et al. | |
| 5,635,009 | A | 6/1997 | Kawamura et al. | |
| 5,659,004 | A | 8/1997 | Takigawa et al. | |
| 5,667,899 | A | 9/1997 | Yusa et al. | |
| 5,698,891 | A | 12/1997 | Tomita et al. | |
| 5,728,473 | A | 3/1998 | Inoue et al. | |
| 5,793,099 | A | 8/1998 | Murakami et al. | |
| 5,827,908 | A | 10/1998 | Arai et al. | |
| 5,837,368 | A | 11/1998 | Hiroe et al. | |
| 5,985,458 | A | 11/1999 | Angelopoulos et al. | |
| 5,989,459 | A | 11/1999 | Nguyen et al. | |
| 6,046,072 | A | 4/2000 | Matsuura et al. | |
| 6,097,089 | A | 8/2000 | Gaku et al. | |
| 6,099,678 | A | 8/2000 | Kotato et al. | |
| 6,201,945 | B1 | 3/2001 | Schlueter, Jr. et al. | |
| 6,248,613 | B1 | 6/2001 | Matsuura et al. | |
| 6,299,513 | B1 | 10/2001 | Tsuihiji et al. | |
| 6,372,080 | B1 | 4/2002 | Matsuura et al. | |
| 6,717,242 | B1 | 4/2004 | Takeda et al. | |
| 2001/0015484 | A1 | 8/2001 | Matsuura et al. | |

FOREIGN PATENT DOCUMENTS

| | | | |
|---|---|---|---|
| EP | 285051 | | 10/1988 |
| EP | 618614 | | 10/1994 |
| EP | 775716 | | 5/1997 |
| EP | 0837498 | A1 | 4/1998 |
| JP | 54-12266 | | 1/1979 |
| JP | 54-138371 | | 10/1979 |
| JP | 58-57730 | | 4/1983 |
| JP | 58-222530 | | 12/1983 |
| JP | 60-38825 | | 2/1985 |
| JP | 60-145630 | | 8/1985 |
| JP | 62-141038 | | 9/1987 |
| JP | 64-19735 | | 1/1989 |
| JP | S64-9226 | A | 1/1989 |
| JP | 64-22744 | | 2/1989 |
| JP | 1-165635 | | 11/1989 |
| JP | H2-168636 | | 6/1990 |
| JP | 2-256251 | | 10/1990 |
| JP | H2-246125 | | 10/1990 |
| JP | 3-228 | | 1/1991 |
| JP | 4-3438 | | 1/1992 |
| JP | 4-227782 | | 8/1992 |
| JP | 5-105850 | A2 | 4/1993 |
| JP | 5-125337 | | 5/1993 |
| JP | H5-117596 | | 5/1993 |
| JP | 5-152355 | | 6/1993 |
| JP | 5-152386 | | 6/1993 |
| JP | 5-152466 | | 6/1993 |
| JP | 5-190022 | | 7/1993 |
| JP | 5-218107 | | 8/1993 |
| JP | 5-331424 | | 12/1993 |
| JP | 5-335379 | | 12/1993 |
| JP | H5-331425 | | 12/1993 |
| JP | 6-104300 | | 4/1994 |
| JP | 06-136300 | | 5/1994 |
| JP | 6-145639 | | 5/1994 |
| JP | H6-151478 | | 5/1994 |
| JP | H6-172714 | | 6/1994 |
| JP | 6-204264 | | 7/1994 |
| JP | 6-218880 | | 8/1994 |
| JP | 6-264035 | | 9/1994 |
| JP | H6-248241 | | 9/1994 |
| JP | H6-256733 | | 9/1994 |
| JP | 6-326240 | | 11/1994 |
| JP | H7-22441 | | 1/1995 |
| JP | 7-90239 | | 4/1995 |
| JP | H7-90244 | A | 4/1995 |
| JP | H7-171154 | | 7/1995 |
| JP | H7-242820 | | 9/1995 |
| JP | 63-289822 | | 11/1998 |
| JP | 3117966 | B2 | 10/2000 |
| JP | 3117971 | B2 | 10/2000 |
| JP | 3117972 | B2 | 10/2000 |
| JP | 3-215014 | | 7/2001 |
| WO | WO-94/21744 | | 9/1994 |

OTHER PUBLICATIONS

Standard Test Method for Peel or Stripping Strength of Adhesive Bonds, American Society for Testing and Materials, reprinted from the Annual Book of ASTM Standards, pp. 1-3.

Standard Test Method for Peel Resistance of Adhesives (T-Peel Test), American Society for Testing and Materials, pp. 1-3.

"Rubber Elastomer Utility Notes", relates to types of rubber and their chemical structure and properties, Jul. 20, 1991.

Notice of Reason for Refusal for Japanese Appln. No. 2000-346979 mailed on Oct. 22, 2002 (with English Translation).

Opposition No. 2001-73554 against Japanese Patent No. 3187400.

Opposition against Japanese Patent No. 3215014.

European Search Report completed Jul. 8, 2002 and mailed Jul. 15, 2002.

International Search Report dated Jan. 23, 1997 (copy not attached).

Notice of Reason for Refusal for Japanese Appln. No. 7-173493 mailed on Aug. 29, 2000 (with English Translation).

Notice of Reason for Refusal for Japanese Appln. No. 2000-156125 mailed on Jan. 16, 2001 (with English Translation).

Opposition No. 2001-71700-01 against Japanese Patent No. 3117966.

International Search Report completed Mar. 12, 1996 and mailed Apr. 2, 1996 for International Application PCT/JP95/02691.

European Search Report completed Mar. 24, 2003 and mailed Mar. 31, 2003 in European application 03001585.3.

European Search Report completed Oct. 28, 1998 and mailed Dec. 10, 1998.

Osaka City Industrial Research Institute et al. ed., Table: List of Properties of Major Thermosetting and Thermoplastic Resins, Plastic Reader 15th Edition (Japan: Plastics Age, Inc., 1987).
Shinji Takeda et al., "Die Bonding Adhesive Film," Hitachi Chemical Technical Report No. 24 (Jan. 1995) (Tokyo: Hitachi Chemical Co. Ltd.).
Surface Energy, p. 538, Chemical Dictionary 7, Kyoritsu Publishing Co.
Thermodynamic equibrium [sic] of wetting, p. 1235, Chemical Handbook Applied Chemistry II, Oct. 15, 1986, Maruzen Co.
Y. Sakamoto et al., "New Type Film-Adhesives for Microelectronics Application," 92 Proceedings of 42nd Electronic Components & Technology Conference, May 18-20, 1992 (New York: The Institute of Electrical and Electronics Engineers, Inc., 1992): pp. 215-218.
Opposition No. 2001-71702-02 against Japanese Patent 3117971 (copy not enclosed).
Fig. 1 (Water absorption (vol. %), Saturation moisture absorption).
Opposition No. 2001-71702-04 against Japanese Patent 3117971 (copy not enclosed).
Opposition No. 2001-71700-03 against Japanese Patent 3117966 (copy not enclosed).
Notice of Reason for Refusal mailed on Sep. 19, 2000 in Japanese Application 2000-156125.
Opposition No. 2001-71703-03 against Japanese Patent 3117972 (copy not enclosed).
Chemical Abstracts, CAS Registry No. 123046-43-5, 1 page.
Adhesives—Peel test for a flexible-bonded-to-rigid test specimen assembly, Part 1: 90 peel International Organization for Standardization, ISO 8510-1:1990(E), 8 pages.

* cited by examiner (a)
3
2
1
(b)
4
5
1
6
7
(c)
8
(d)
(e)
9
8
6
1
5

SEMICONDUCTOR DEVICE AND PROCESS FOR FABRICATION THEREOF

This application is a continuation of U.S. patent application Ser. No. 09/543,247, filed Apr. 5, 2000, now abandoned which in turn is a continuation of U.S. patent application Ser. No. 08/981,702, filed Mar. 31, 1998 now abandoned, which is a 371 of International Application No. PCT/JP96/01886, filed Jul. 8, 1996, which in turn is related to and claims the early filing date of Japanese Patent Application No. 7-171154, filed Jul. 6, 1995. The entire disclosures of the above applications are hereby incorporated by reference.

TECHNICAL FIELD

This invention relates to a semiconductor device having a support member such as a lead frame to which a semiconductor die or chip is attached using a die-bonding material and encapsulated with resin, and a process for the fabrication of such a semiconductor device.

BACKGROUND ART

As methods by which semiconductor chips are attached to lead frames, a method has been used in which a die-bonding material is fed onto the lead frame and the semiconductor chip is bonded thereto.

Such a die-bonding material is known to include, e.g., Au—Si eutectics, solders and resin pastes. Of these, Au—Si eutectics have problems in that they are expensive, have a high modulus of elasticity, and require vibration at the bonding portion. The solders have problems in that they can not withstand temperatures equal to or greater than their melting temperature and have a high modulus of elasticity.

As for the resin pastes, silver paste is the most commonly available. Compared with other materials, silver paste is inexpensive, has a high heat resistance reliability and has a low modulus of elasticity. Hence, they are most widely used as bonding materials for the lead frames of ICs and LSIs.

In recent years, there has been a rapid increase in demand for high-density packaging as electronic machinery has been made smaller in size and thickness. In semiconductor packaging, conventional pin insertion packaging has been substituted by surface packaging, which has become the prevailing packaging method suitable for high-density packaging.

In surface packaging, in order to directly solder leads to printed-wiring substrates, packaging is carried out by infrared reflowing, vapor phase reflowing or solder dipping while heating the whole package.

During this packaging, the whole package is exposed to high temperatures of 210° C. to 260° C. Hence, any presence of moisture in the package causes explosive vaporization of the moisture to cause package cracks (hereinafter "reflow cracks").

Such reflow cracks may cause a great lowering of the reliability of semiconductor packages, bringing about a serious technical problem.

The mechanism by which reflow cracks ascribable to die-bonding materials occur is as follows: During storage of semiconductor packages, (1) die-bonding materials absorb moisture, (2) this moisture is vaporized upon heating when packaged by reflowing and soldering, and (3) vapor pressure thus produced causes breaking or separation of the die-bonding material layers, (4) so that the reflow cracks occur.

While reflow crack resistance of encapsulant has been improved, the reflow cracks ascribable to die-bonding materials provide a serious matter especially in thin-type packaging. Thus, it is strongly sought to improve its reflow crack resistance.

The silver paste, having been most commonly used, tends to cause reflow cracks because it has become difficult with the increase in size of chips to uniformly coat the silver paste on the whole surface requiring area and also because it is pasty itself and therefore tends to cause voids in bonding layers.

DISCLOSURE OF THE INVENTION

The present invention provides a semiconductor device that employs a filmy organic die-bonding material, may cause no reflow cracks and has good reliability, and a process for fabrication thereof.

In the present invention, a filmy organic die-bonding material is used. This filmy organic material is such a filmy material that is mainly made of an organic material such as epoxy resin, silicone resin, acrylic resin, or polyimide resin (including an organic material containing a metal filler or an inorganic material filler added thereto). The filmy organic die-bonding material which has been heated is contact-bonded to a support member such as a lead frame, and a semiconductor chip is placed on the filmy organic die-bonding material and heat is applied to bond the chip. More particularly, resin paste is provided in the form of a film so that die-bonding material is uniformly applied to the bonding portion.

FIG. 1 illustrates an example of a process for fabricating the semiconductor device of the present invention.

The filmy organic die-bonding material 1 is cut in a prescribed size with a cutter 2 ((a) in FIG. 1).

The filmy organic die-bonding material 1 is contact-bonded to a die pad 6 of a lead frame 5 on a heating platen 7 by means of a contact press ((b) in FIG. 1). The contact bonding may preferably be carried out under conditions of a temperature of from 100° C. to 250° C., a press time of from 0.1 second to 20 seconds and a pressure of from 4 gf/mm$^2$ to 200 gf/mm$^2$.

A semiconductor chip 8 is put on the filmy organic die-bonding material 1 stuck to the die pad 6, followed by heat contact bonding (i.e., die bonding) ((c) in FIG. 1). The die bonding may preferably be carried out under conditions of a temperature of from 100° C. to 350° C., a bonding time of from 0.1 second to 20 seconds and a pressure of from 0.1 gf/mm$^2$ to 30 gf/mm$^2$. More preferable conditions for die bonding are of a temperature of from 150° C. to 250° C., a bonding time of 0.1 (inclusive) second to 2 seconds and a pressure of 0.1 gf/mm$^2$ to 4 gf/mm$^2$, and the most preferable conditions for die bonding are of a temperature of from 150° C. to 250° C., a bonding time of 0.1 (inclusive) second to 1.5 (exclusive) seconds and a pressure of 0.3 gf/mm$^2$ to 2 gf/mm$^2$.

Then, the step of wire bonding ((d) in FIG. 1) follows, and the step of encapsulating the semiconductor chip with resin ((e) in FIG. 1) further follows. Thus, the semiconductor device is produced. Reference numeral 9 denotes an encapsulant resin.

For example, the filmy organic die-bonding material of the present invention is prepared by dissolving or dispersing an organic material such as polyimide or epoxy resin and optionally an additive such as a metal filler in an organic solvent to obtain a coating varnish, coating this coating varnish on a carrier film such as biaxially stretched polypropylene film, followed by evaporation of the solvent, and peeling the filmy material from the carrier film. When prepared in this way, a film having self-supporting properties can be obtained.

The present inventors have discovered that the occurrence of reflow cracks in semiconductor device correlates with the properties or characteristics of the filmy organic die-bonding material, and have made detailed studies on the relationship between the occurrence of reflow cracks and the characteristics of the filmy organic die-bonding material. As a result, they have accomplished the present invention.

According to a first embodiment of the present invention, the semiconductor device and the process for its fabrication are characterized in that, in the semiconductor device having a support member to which a semiconductor chip is attached using a die-bonding material and encapsulated with resin, a filmy organic die-bonding material having a water absorption of 1.5% by volume or less is used as the die-bonding material.

According to a second embodiment of the present invention, the semiconductor device and the process for its fabrication are characterized in that, in the semiconductor device having a support member to which a semiconductor chip is attached using a die-bonding material and then encapsulated with resin, a filmy organic die-bonding material having a saturation moisture absorption of 1.0% by volume or less is used as the die-bonding material.

According to a third embodiment of the present invention, the semiconductor device and the process for its fabrication are characterized in that, in the semiconductor device having a support member to which a semiconductor chip is attached using a die-bonding material and then encapsulated with resin, a filmy organic die-bonding material having a residual volatile component in an amount not more than 3.0% by weight is used as the die-bonding material.

According to a fourth embodiment of the present invention, the semiconductor device and the process for its fabrication are characterized in that, in the semiconductor device having a support member to which a semiconductor chip is attached using a die-bonding material and then encapsulated with resin, a filmy organic die-bonding material having a modulus of elasticity of 10 MPa or less at a temperature of 250° C. is used as the die-bonding material.

According to a fifth embodiment of the present invention, the semiconductor device and the process for its fabrication are characterized in that, in the semiconductor device having a support member to which a semiconductor chip is attached using a die-bonding material and then encapsulated with resin, a filmy organic die-bonding material having, at the stage where the semiconductor chip is bonded to the support member, a void volume of 10% or less in terms of voids present in the die-bonding material and at the interface between the die-bonding material and the support member is used as the die-bonding material.

According to a sixth embodiment of the present invention, the semiconductor device and the process for its fabrication are characterized in that, in the semiconductor device having a support member to which a semiconductor chip is attached using a die-bonding material and then encapsulated with resin, a filmy organic die-bonding material having a peel strength of 0.5 Kgf/5×5 mm chip or above at the stage where the semiconductor chip is bonded to the support member is used as the die-bonding material.

According to a seventh embodiment of the present invention, the semiconductor device and the process for its fabrication are characterized in that, in the semiconductor device having a support member to which a semiconductor chip is attached using a die-bonding material and then encapsulated with resin, a filmy organic die-bonding material i) having a planar dimension not larger than the planar dimension of the semiconductor chip, and ii) not protruding outward from the region of the semiconductor chip (i.e., not to protrude from the interface between the semiconductor chip and the support member) at the stage where the semiconductor chip is bonded to the support member is used as the die-bonding material.

In the embodiments of the present invention, the values of the properties or characteristics of the filmy organic die-bonding materials, such as a water absorption of 1.5% by volume or less, a saturation moisture absorption of 1.0% by volume or less, a residual volatile component in an amount not more than 3.0% by weight, or a modulus of elasticity of 10 MPa or less at a temperature of 250° C., are the values measured at the stage before the filmy organic die-bonding material is stuck onto the support member.

The filmy organic die-bonding material used in the first embodiment of the present invention, having a water absorption of 1.5% by volume or less, the filmy organic die-bonding material used in the second embodiment of the present invention, having a saturation moisture absorption of 1.0% by volume or less, the filmy organic die-bonding material used in the fourth embodiment of the present invention, having a modulus of elasticity of 10 MPa or less at a temperature of 250° C., and the filmy organic die-bonding material used in the sixth embodiment of the present invention, having a peel strength of 0.5 Kgf/5×5 mm chip or above at the stage where the semiconductor chip is bonded to the support member, can be produced by controlling composition of the filmy organic die-bonding material, e.g., the structure of polymers such as polyimide and the content of fillers such as silver.

The filmy organic die-bonding material used in the third embodiment of the present invention, having a residual volatile component in an amount not more than 3.0% by weight, and the filmy organic die-bonding material used in the fifth embodiment of the present invention, having, at the stage where the semiconductor chip is bonded to the die-bonding material, a void volume of 10% or less in terms of voids present in the die-bonding material and at the interface between the die-bonding material and the support member, can be produced by controlling the conditions for producing the filmy organic die-bonding material, e.g., drying temperature, drying time and so forth.

The semiconductor chip includes commonly available semiconductor chips of ICs, LSIs, VLSIs and so forth, any of which may be used. The die bonding materials according to the present invention is suitably used for the semiconductor chip as large a 5×5 mm or larger. The support member includes lead frames having die pads, ceramic wiring boards and glass-polyimide wiring boards, any of which may be used. FIG. 3 shows a plan view of an example of lead frames having die pads. The lead frame 40 shown in FIG. 3 has die pads 41.

As the filmy organic die-bonding material, not only those having single-layer structure but also those having multi-layer structure may be used.

In the present invention, the filmy organic die-bonding material may have at the same time two or more properties or characteristics of those described above.

For example, properties or characteristics the filmy organic die-bonding material may preferably have at the same time are as follows:

(1) A filmy organic die-bonding material having a saturation moisture absorption of 1.0% by volume or less and a residual volatile component in an amount not more than 3.0% by weight;

(2) A filmy organic die-bonding material having a saturation moisture absorption of 1.0% by volume or less, and a peel strength of 0.5 Kgf/5×5 mm chip or above at the stage where the semiconductor chip is bonded to the support member;

(3) A filmy organic die-bonding material having a residual volatile component in an amount not more than 3.0% by weight and a peel strength of 0.5 Kgf/5×5 mm chip or above at the stage where the semiconductor chip is bonded to the support member; and (4) A filmy organic die-bonding material having a saturation moisture absorption of 1.0% by volume or less, a residual volatile component in an amount not more than 3.0% by weight, and a peel strength of 0.5 Kgf/5×5 mm chip or above at the stage where the semiconductor chip is bonded to the support member.

In the present invention, the foregoing properties or characteristics of the filmy organic die-bonding material may be in any combination in accordance with the purposes for which it is used.

The above (1) to (4) filmy organic die-bonding materials or the filmy organic die-bonding materials having the above properties or characteristics in any other combinations may preferably be used as filmy organic die-bonding materials each i) having a planar dimension not larger than the planar dimension of the semiconductor chip, and ii) not protruding outward from the region of the semiconductor chip at the stage where the semiconductor chip is bonded to the support member.

The semiconductor device of the present invention is free from reflow cracks which might otherwise occur during reflow soldering for the packaging of semiconductor devices, and has good reliability.

As the organic material constituting the filmy organic die-bonding material of the present invention, polyimide resin is preferred.

Tetracarboxylic dianhydrides used as starting materials for the polyimide resin include:

1,2-(ethylene)bis(trimellitate anhydride),
1,3-(trimethylene)bis(trimellitate anhydride),
1,4-(tetramethylene)bis(trimellitate anhydride),
1,5-(pentamethylene)bis(trimellitate anhydride),
1,6-(hexamethylene)bis(trimellitate anhydride),
1,7-(heptamethylene)bis(trimellitate anhydride),
1,8-(octamethylene)bis(trimellitate anhydride),
1,9-(nonamethylene)bis(trimellitate anhydride),
1,10-(decamethylene)bis(trimellitate anhydride),
1,12-(dodecamethylene)bis(trimellitate anhydride),
1,16-(hexadecamethylene)bis(trimellitate anhydride),
1,18-(octadecamethylene)bis(trimellitate anhydride),
pyromellitic dianhydride,
3,3',4,4'-diphenyltetracarboxylic dianhydride,
2,2',3,3'-diphenyltetracarboxylic dianhydride,
2,2-bis(3,4-dicarboxyphenyl)propane dianhydride,
2,2-bis(2,3-dicarboxyphenyl)propane dianhydride,
1,1-bis(2,3-dicarboxyphenyl)ethane dianhydride,
1,1-bis(3,4-dicarboxyphenyl)ethane dianhydride,
bis(2,3-dicarboxyphenyl)methane dianhydride,
bis(3,4-dicarboxyphenyl)methane dianhydride,
bis(3,4-dicarboxyphenyl)sulfone dianhydride,
3,4,9,10-perylenetetracarboxylic dianhydride,
bis(3,4-dicarboxyphenyl)ether dianhydride,
benzene-1,2,3,4-tetracarboxylic dianhydride,
3,4,3',4'-benzophenonetetracarboxylic dianhydride,
2,3,2',3'-benzophenonetetracarboxylic dianhydride,
2,3,3',4'-benzophenonetetracarboxylic dianhydride,
1,2,5,6-naphthalenetetracarboxylic dianhydride,
2,3,6,7-naphthalenetetracarboxylic dianhydride,
1,2,4,5-naphthalene-tetracarboxylic dianhydride,
1,4,5,8-naphthalene-tetracarboxylic dianhydride,
2,6-dichloronaphthalene-1,4,5,8-tetracarboxylic dianhydride,
2,7-dichloronaphthalene-1,4,5,8-tetracarboxylic dianhydride,
2,3,6,7-tetrachloronaphthalene-1,4,5,8-tetracarboxylic dianhydride,
phenanthrene-1,8,9,10-tetracarboxylic dianhydride,
pyrazine-2,3,5,6-tetracarboxylic dianhydride,
thiophene-2,3,4,5-tetracarboxylic dianhydride,
2,3,3',4'-biphenyltetracarboxylic dianhydride,
3,4,3',4'-biphenyltetracarboxylic dianhydride,
2,3,2',3'-biphenyltetracarboxylic dianhydride,
bis(3,4-dicarboxyphenyl)dimethylsilane dianhydride,
bis(3,4-dicarboxyphenyl)methylphenylsilane dianhydride,
bis(3,4-dicarboxyphenyl)diphenylsilane dianhydride,
1,4-bis(3,4-dicarboxyphenyldimethylsilyl)benzene dianhydride,
1,3-bis(3,4-dicarboxyphenyl)-1,1,3,3-tetramethyldicyclohexane dianhydride,
p-phenylenebis(trimellitate anhydride),
ethylenetetracarboxylic dianhydride,
1,2,3,4-butanetetracarboxylic dianhydride,
decahydronaphthalene-1,4,5,8-tetracarboxylic dianhydride,
4,8-dimethyl-1,2,3,5,6,7-hexahydronaphthalene-1,2,5,6-tetracarboxylic dianhydride,
cyclopentane-1,2,3,4-tetracarboxylic dianhydride,
pyrrolidine-2,3,4,5-tetracarboxylic dianhydride,
1,2,3,4-cyclobutanetetracarboxylic dianhydride,
bis(exo-bicyclo[2,2,1]heptane-2,3-dicarboxylic dianhydride)sulfone,
bicyclo-(2,2,2)-octo-7-ene-2,3,5,6-tetracarboxylic dianhydride,
2,2-bis(3,4-dicarboxyphenyl)hexafluoropropane dianhydride,
2,2-bis[4-(3,4-dicarboxyphenoxy)phenyl]hexafluoropropane dianhydride,
4,4'-bis(3,4-dicarboxyphenoxy)diphenylsulfide dianhydride,
1,4-bis(2-hydroxyhexafluoroisopropyl)benzenebis(trimellitic anhydride),
1,3-bis(2-hydroxyhexafluoroisopropyl)benzenebis(trimellitic anhydride),
5-(2,5-dioxotetrahydrofuril)-3-methyl-3-cyclohexene-1,2-dicarboxylic dianhydride, and
tetrahydrofuran-2,3,4,5-tetracarboxylic dianhydride.

Any of these may be used in the form of a mixture of two or more kinds.

Diamines used as starting materials for the polyimide resin include aromatic diamines such as:

o-phenylenediamine,
m-phenylenediamine,
p-phenylenediamine,
3,3'-diaminodiphenyl ether,
3,4'-diaminodiphenyl ether,
4,4'-diaminodiphenyl ether,
3,3'-diaminodiphenylmethane,
3,4'-diaminodiphenylmethane, 4,4'-diaminodiphenylmethane,
bis(4-amino-3,5-dimethylphenyl)methane,
bis(4-amino-3,5-diisopropylphenyl)methane,
3,3'-diaminodiphenyldifluoromethane,
3,4'-diaminodiphenyldifluoromethane,
4,4'-diaminodiphenyldifluoromethane,
3,3'-diaminodiphenyl sulfone,
3,4'-diaminodiphenyl sulfone,
4,4'-diaminodiphenyl sulfone,
3,3'-diaminodiphenyl sulfide,
3,4'-diaminodiphenyl sulfide,
4,4'-diaminodiphenyl sulfide,
3,3'-diaminodiphenyl ketone,
3,4'-diaminodiphenyl ketone,
4,4'-diaminodiphenyl ketone,
2,2-bis(3-aminophenyl)propane,
2,2'-(3,4'-diaminodiphenyl)propane,
2,2-bis(4-aminophenyl)propane,
2,2-bis(3-aminophenyl)hexafluoropropane,
2,2-(3,4'-diaminodiphenyl)hexafluoropropane,
2,2-bis(4-aminophenyl)hexafluoropropane,
1,3-bis(3-aminophenoxy)benzne,
1,4-bis(3-aminophenoxy)benzene,
1,4-bis(4-aminophenoxy)benzene,
3,3'-(1,4-phenylenebis(1-methylethylidene))bisaniline
3,4'-(1,4-phenylenebis(1-methylethylidene))bisaniline
4,4'-(1,4-phenylenebis(1-methylethylidene))bisaniline
2,2-bis(4-(3-aminophenoxy)phenyl)propane,
2,2-bis(4-(4-aminophenoxy)phenyl)propane,
2,2-bis(4-(3-aminophenoxy)phenyl)hexafluoropropane,
2,2-bis(4-(4-aminophenoxy)phenyl)hexafluoropropane,
bis(4-(3-aminophenoxy)phenyl)sulfide,
bis(4-(4-aminophenoxy)phenyl)sulfide,
bis(4-(3-aminophenoxy)phenyl)sulfone, and
bis(4-(4-aminophenoxy)phenyl)sulfone;

and aliphatic diamines such as:
1,2-diaminoethane,
1,3-diaminopropane,
1,4-diaminobutane,
1,5-diaminopentane,
1,6-diaminohexane,
1,7-diaminoheptane,
1,8-diaminooctane,
1,9-diaminononane,
1,10-diaminodecane,
1,11-diaminoundecane, and
1,12-diaminododecane.

Any of these may be used in the form of a mixture of two or more kinds.

The polyimide can be obtained by subjecting the tetracarboxylic dianhydride and the diamine to condensation by a known method. More specifically, using the tetracarboxylic dianhydride and the diamine in substantially equimolar weights (the respective components may be added in any order), the reaction is carried out in an organic solvent at a reaction temperature of 80° C. or below, and preferably at 0° C. to 50° C. With the progress of the reaction, the viscosity of reaction mixture gradually increases, so that a polyimide precursor polyamic acid is formed.

The polyimide can be obtained by dehydration ring closure of the above reaction product (polyamic acid). The dehydration ring closure may be carried out by a method of heat treatment at 120° C. to 250° C. or by a chemical method.

Epoxy resin of glycidyl ether type, glycidylamine type, glycidyl ester type or alicyclic type may be used as organic materials for the filmy organic die-bonding materials of the present invention.

As mentioned above, in the process for the fabrication of a semiconductor device according to the present invention, the die bonding may preferably be carried out under conditions of a temperature of from 100° C. to 350° C., a bonding time of from 0.1 second to 20 seconds and a pressure of from 0.1 gf/mm$^2$ to 30 gf/mm$^2$. More preferably, it is carried out under conditions of a temperature of from 150° C. to 250° C., a bonding time of 0.1 (inclusive) second to 2 seconds and a pressure of 0.1 gf/mm$^2$ to 40 gf/mm$^2$, and the most preferably, under conditions of from 150° C. to 250° C., a bonding time of 0.1 (inclusive) second to 1.5 (exclusive) seconds and a pressure of 0.3 gf/mm$^2$ to 2 gf/mm$^2$.

When a filmy organic die-bonding material whose elastic modulus at a temperature of 250° C. is not more than 10 MPa is used, a sufficient peel strength (for example, 0.5 Kgf/5×5 mm chip or more) can be obtained by carrying out die-bonding under conditions of a temperature of from 150° C. to 250° C., a bonding time of 0.1 (inclusive) second to 2 seconds and a pressure of 0.1 gf/mm$^2$ to 4 gf/mm$^2$.

BEST MODE FOR CARRYING OUT THE INVENTION

Figure 1:
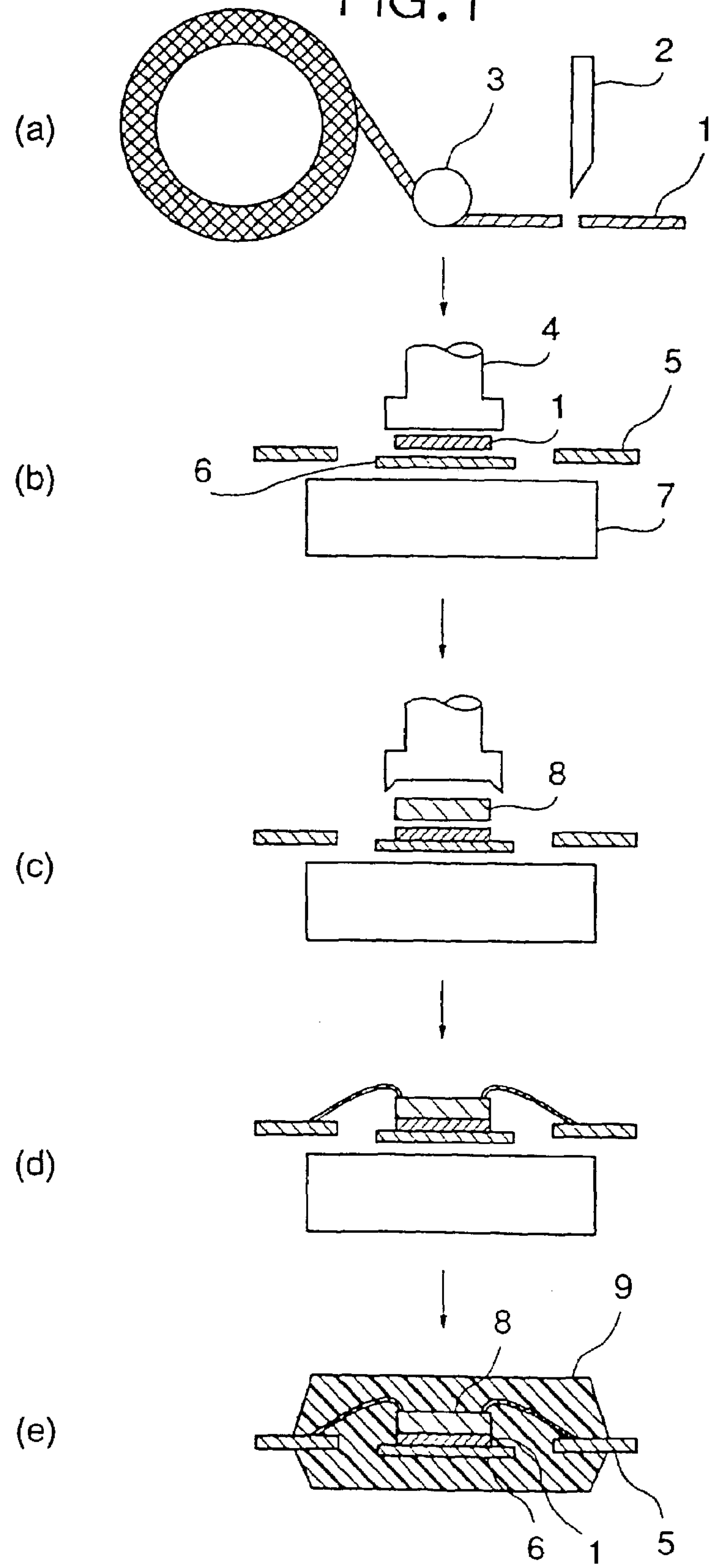
FIG. 1 cross-sectionally illustrates an example of a process for fabricating the semiconductor device of the present invention.

The present invention will be described below in greater detail by giving Examples, but an embodiment of the present invention is not limited to these examples. All of polyimides used in the following examples are obtained by heating the mixture of acid dianhydride with diamine being the same mol as the acid dianhydride, in solvent, so as to polymerize them. In the following examples, polyimide A is a polyimide synthesized from 1,2-(ethylene)bis(trimellitate anhydride) and bis(4-amino-3,5-dimethylphenyl)methane; polyimide B is a polyimide synthesized from 1,2-(ethylene)bis(trimellitate anhydride) and 4,4'-diaminodiphenylether; polyimide C is a polyimide synthesized from 1,2-(ethylene)bis(trimellitate anhydride) and bis(4-amino-3,5-diisopropylphenyl) methane; polyimide D is a polyimide synthesized from 1,2-(ethylene)bis(trimellitate anhydride) and 2,2-bis[4-(4-aminophenoxy)phenyl]propane; polyimide E is a polyimide synthesized from a mixture of 1,2-(ethylene)bis(trimellitate anhydride) and 1,10-(decamethylene)bis(trimellitate anhydride) being the same mol as the mixture, and 2,2-bis[4-(4-aminophenoxy)phenyl] propane; polyimide F is a polyimide synthesized from 1,10-(decamethylene)bis(trimellitate anhydride) and 2,2-bis[4-(4-aminophenoxy)phenyl] propane.

EXAMPLE 1

To 100 g of each polyimide shown in Table 1 and 10 g of epoxy resin, 280 g of an organic solvent was added to make a solution. To the solution obtained, silver powder was added in a stated amount, followed by thorough stirring so as to be homogeneously dispersed, to obtain a coating varnish.

This coating varnish was coated on a carrier film (OPP film; biaxially stretched polypropylene), followed by drying in a dryer with internal air circulation to cause the solvent to evaporate and dry the varnish. Thus, filmy organic die-bonding materials having the composition and water absorption as shown in Table 1 were prepared.

The filmy organic die-bonding materials as shown in Table 1 were each stuck onto the tab of the lead frame while heating at 160° C. On the lead frame to which the filmy organic die-bonding material was thus stuck, a semiconductor chip was mounted by die bonding carried out under conditions of a temperature of 300° C., a pressure of 12.5 gf/mm$^2$ and a bonding time of 5 seconds, followed by wire bonding and then molding with an encapsulant material (trade name CEL-9000, available from Hitachi Chemical Co., Ltd.). Thus, a semiconductor device was fabricated (QFP: (Quad Flat Package) package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR (infrared) reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 1.

TABLE 1

| No. | Composition of film: Polyimide | Composition of film: Ag content (wt. %) | Water absorption (%) | Rate of occurrence of reflow cracks (%) |
|---|---|---|---|---|
| 1 | Polyimide A | 80 | 2.0 | 100 |
| 2 | Polyimide B | 80 | 1.9 | 100 |
| 3 | Polyimide C | 80 | 1.8 | 100 |
| 4 | Polyimide D | 52 | 1.5 | 0 |
| 5 | Polyimide E | 60 | 1.2 | 0 |
| 6 | Polyimide E | 0 | 1.0 | 0 |
| 7 | Polyimide F | 60 | 0.9 | 0 |
| 8 | Polyimide F | 0 | 0.8 | 0 |
| 9 | Polyimide F | 40 | 0.7 | 0 |
| 10 | Polyimide F | 80 | 0.4 | 0 |
| Comparative Example: | | | | |
| Silver paste* | | | 1.7 | 100 |

*As the silver paste, EPINAL (trade name; available from Hitachi Chemical Co., Ltd.) was used.

Measurement of Water Absorption

A film with a size of 50×50 mm is used as a sample. The sample is dried at 120° C. for 3 hours in a vacuum dryer, and then left to cool in a desiccator. Thereafter, the dried weight of the sample is measured and is regarded as M1. The sample is immersed in distilled water at room temperature for 24 hours, and then taken out. The surface of the sample is wiped with filter paper and its weight is immediately measured and is regarded as M2.

The water absorption is calculated according to the following:

$$[(M2-M1)/(M1/d)]\times 100=\text{Water absorption (vol. \%)}$$

wherein d is the,density of the filmy organic die-bonding material.

EXAMPLE 2

To 100 g of each polyimide shown in Table 2 and 10 g of epoxy resin, 280 g of an organic solvent was added to make a solution. To the solution obtained, silver powder was added in a stated amount, followed by thorough stirring so as to be homogeneously dispersed, to obtain a coating varnish.

This coating varnish was coated on a carrier film (OPP film; biaxially stretched polypropylene), followed by drying in a dryer with internal air circulation to cause the solvent to evaporate and dry the varnish. Thus, filmy organic die-bonding materials having the composition and saturation moisture absorption as shown in Table 2 were prepared.

The filmy organic die-bonding materials as shown in Table 2 were each stuck onto the tab of the lead frame while heating at 160° C. On the lead frame to which the filmy organic die-bonding material was thus stuck, a semiconductor chip was mounted by die bonding carried out under conditions of a temperature of 300° C., a pressure of 12.5 gf/mm$^2$ and a bonding time of 5 seconds in examples No. 1 to 6 and the comparative example, and under conditions of a temperature of 230° C., a pressure of 0.6 gf/mm$^2$ and a bonding time of 1 second in examples No. 7 to 10, followed by wire bonding and then molding with an encapsulant material (trade name CEL-9000, available from Hitachi Chemical Co., Ltd.). Thus, a semiconductor device was fabricated (QFP package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 2.

TABLE 2

| No. | Composition of film: Polyimide | Composition of film: Ag content (wt. %) | Saturation moisture absorption (%) | Rate of occurrence of reflow cracks (%) |
|---|---|---|---|---|
| 1 | Polyimide A | 80 | 1.7 | 100 |
| 2 | Polyimide B | 80 | 1.5 | 100 |
| 3 | Polyimide C | 80 | 1.4 | 100 |
| 4 | Polyimide D | 80 | 1.0 | 0 |
| 5 | Polyimide D | 60 | 0.8 | 0 |
| 6 | Polyimide D | 40 | 0.6 | 0 |
| 7 | Polyimide F | 0 | 0.5 | 0 |
| 8 | Polyimide F | 60 | 0.4 | 0 |
| 9 | Polyimide F | 52 | 0.3 | 0 |
| 10 | Polyimide F | 40 | 0.2 | 0 |
| Comparative Example: | | | | |
| Silver paste* | | | 1.2 | 100 |

*As the silver paste, EPINAL (trade name; available from Hitachi Chemical Co., Ltd.) was used.

Measurement of Saturation Moisture Absorption

A circular filmy organic die-bonding material of 10 mm diameter is used as a sample. The sample is dried at 120° C.

for 3 hours in a vacuum dryer, and then left to cool in a desiccator. Thereafter, the dried weight of the sample is measured and is regard as M1. The sample is moisture-absorbed in a thermo-hygrostat of 85° C. and 85% RH, and then taken out. Its weight is immediately measured until the values of weight become constant. This weight is regarded as M2.

The saturation moisture absorption is calculated according to the following:

$$[(M2-M1)/(M1/d)]\times 100=\text{saturation moisture absorption (vol. \%)}$$

wherein d is the density of the filmy organic die-bonding material.

EXAMPLE 3

To 100 g of polyimide F and 10 g of epoxy resin, 140 g of dimethylacetamide and 140 g of cyclohexanone were added as organic solvents to make a solution. To the solution obtained, 74 g of silver powder was added, followed by thorough stirring so as to be homogenously dispersed, to obtain a coating varnish.

This coating varnish was coated on a carrier film (OPP film; biaxially stretched polypropylene), followed by heating at temperatures of from 80° C. to 120° C. in a dryer with internal air circulation to cause the solvent to evaporate and dry the varnish. Thus, filmy organic die-bonding materials having the residual volatile component as shown in Table 3 were prepared. Here, when the drying temperature was higher than 120° C., the coating was dried on the OPP film at 80° C. for 30 minutes, and thereafter the resulting filmy organic die-bonding material was peeled from the OPP film, which was then held on an iron frame, and again heated in the dryer to dry it.

The filmy organic die-bonding materials as shown in Table 3 were each stuck onto the tab of the lead frame while heating at 160° C. On the lead frame to which the filmy organic die-bonding material was thus stuck, a semiconductor chip was mounted by die bonding carried out under conditions of a temperature of 230° C., a pressure of 0.6 gf/mm$^2$ and a bonding time of 1 second, followed by wire bonding and then molding with an encapsulant material (trade name CEL-9000, available from Hitachi Chemical Co., Ltd.). Thus, a semiconductor device was fabricated (QFP package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 3.

TABLE 3

| No. | Drying temp. (° C.) | Drying time (min) | Residual volatile component (wt. %) | Voids in film | Rate of occurrence of reflow cracks (%) |
|---|---|---|---|---|---|
| 1 | 80 | 30 | 6.5 | Present | 100 |
| 2 | 100 | 2 | 4.9 | Present | 100 |
| 3 | 100 | 4 | 4.2 | Present | 100 |
| 4 | 100 | 10 | 3.8 | Present | 80 |
| 5 | 100 | 30 | 3.5 | Present$_i$ | 60 |
| 6 | 120 | 10 | 3.0 | None | 0 |
| 7 | 120 | 75 | 2.2 | None | 0 |
| 8 | 140 | 10 | 2.0 | None | 0 |
| 9 | 160 | 10 | 1.5 | None | 0 |
| 10 | 140 | 60 | 1.2 | None | 0 |
| 11 | 160 | 30 | 0.7 | None | 0 |
| Comparative Example: | | | | | |
| Silver paste* | | | 15.0 | Present | 100 |

* As the silver paste, EPINAL (trade name; available from Hitachi Chemical Co., Ltd.) was used.

Measurement of Residual Volatile Component

A filmy organic die-bonding material with a size of 50×50 mm is used as a sample. The weight of the sample is measured and is regarded as M1. The sample is heated at 200° C. for 2 hours in a hygrostat with internal air circulation, and thereafter its weight is immediately measured and is regarded as M2.

The residual volatile component is calculated according to the following:

$$[(M2-M1)/M1]\times 100=\text{residual volatile component (wt. \%)}$$

EXAMPLE 4

To 100 g of polyimide D and 10 g of epoxy resin, 140 g of dimethylacetamide and 140 g of cyclohexanone were added as organic solvents to make a solution. To the solution obtained, 74 g of silver powder was added, followed by thorough stirring so as to be homogeneously dispersed, to obtain a coating varnish.

This coating varnish was coated on a carrier film (OPP film; biaxially stretched polypropylene), followed by heating at temperatures of from 80° C. to 120° C. in a dryer with internal air circulation to cause the solvent to evaporate and dry the varnish. Thus, filmy organic die-bonding materials having the void volume as shown in Table 4 were prepared. Here, when the drying temperature was higher than 120° C., the coating was dried on the OPP film at 80° C. for 30 minutes, and thereafter the resulting filmy organic die-bonding material was peeled from the OPP film, which was then held on an iron frame, and again heated in the dryer to dry it.

Herein, the void volume refers to a void volume in terms of voids present in the die-bonding material and at the interface between the die-bonding material and the support member at the stage where the semiconductor chip is bonded to the support member.

The filmy organic die-bonding materials as shown in Table 4 were each stuck onto the tab of the lead frame while heating at 160° C. On the lead frame to which the filmy organic die-bonding material was thus stuck, a semiconductor chip was mounted by die bonding carried out under conditions of a temperature of 300° C., a pressure of 12.5 gf/mm$^2$ and a bonding time of 5 seconds, followed by wire bonding and then molding with an encapsulant material (trade name CEL-9000, available from Hitachi Chemical Co., Ltd.). Thus, a semiconductor device was fabricated (QFP package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 4.

TABLE 4

| No. | Drying temp. (° C.) | Drying time (min) | Void volume (wt. %) | Rate of occurrence of reflow cracks (%) |
|---|---|---|---|---|
| 1 | 80 | 30 | 30 | 100 |
| 2 | 100 | 2 | 22 | 100 |
| 3 | 100 | 10 | 17 | 80 |
| 4 | 120 | 10 | 10 | 0 |
| 5 | 120 | 75 | 7 | 0 |
| 6 | 140 | 10 | 5 | 0 |
| 7 | 160 | 30 | 0 | 0 |
| Comparative Example: | | | | |
| Silver paste* | | | 40 | 100 |

*As the silver paste, EPINAL (trade name; available from Hitachi Chemical Co., Ltd.) was used.

Measurement of Void Volume

A silicone chip is bonded to a lead frame using the filmy organic die-bonding material to make a sample. A photograph of a top view of the sample is taken using a soft X-ray device. The area percentage of voids in the photograph is measured using an image analyzer, and the area percentage of the voids seen through the sample from its top is regarded as void volume (%).

EXAMPLE 5

To 100 g of each polyimide shown in Table 5 and 10 g of epoxy resin, 280 g of an organic solvent was added to make a solution. To the solution obtained, silver powder was added in a stated amount, followed by thorough stirring so as to be homogeneously dispersed, to obtain a coating varnish.

This coating varnish was coated on a carrier film (OPP film; biaxially stretched polypropylene), followed by drying in a dryer with internal air circulation to cause the solvent to evaporate and dry the varnish. Thus, filmy organic die-bonding materials having the composition and peel strength as shown in Table 5 were prepared.

Herein, the peel strength refers to the peel strength of the filmy organic die-bonding material at the stage where the semiconductor chip is bonded to the support member through the filmy organic die-bonding material.

The filmy organic die-bonding materials as shown in Table 5 were each stuck onto the tab of the lead frame while heating at 160° C. On the lead frame to which the filmy organic die-bonding material was thus stuck, a semiconductor chip was mounted by die bonding carried out under conditions of a temperature of 300° C., a pressure of 12.5 gf/mm$^2$ and a bonding time of 5 seconds with respect to examples No. 1 to 5, and conditions of a temperature of 230° C., a pressure of 0.6 gf/mm$^2$ and a bonding time of 1 second with respect to examples No. 6 to 10, followed by wire bonding and then molding with an encapsulant material (trade name CEL-9000, available from Hitachi Chemical Co., Ltd.). Thus, a semiconductor device was fabricated (QFP package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 5.

TABLE 5

| | Composition of film | | Peel strength | Rate of occurrence of |
|---|---|---|---|---|
| No. | Polyimide | Ag content (wt. %) | (Kgf/ 5 × 5 mm chip) | reflow cracks (%) |
| 1 | Polyimide B | 80 | 0.2 | 100 |
| 2 | Polyimide C | 80 | 0.3 | 100 |
| 3 | Polyimide A | 80 | 0.4 | 80 |
| 4 | Polyimide D | 80 | 0.5 | 0 |
| 5 | Polyimide F | 80 | 0.7 | 0 |
| 6 | Polyimide F | 0 | 0.8 | 0 |
| 7 | Polyimide F | 30 | 1.0 | 0 |
| 8 | Polyimide F | 20 | 1.5 | 0 |
| 9 | Polyimide F | 40 | >2.0 | 0 |
| 10 | Polyimide F | 52 | >2.0 | 0 |

Method of Measuring a Peel Strength

Figure 2:
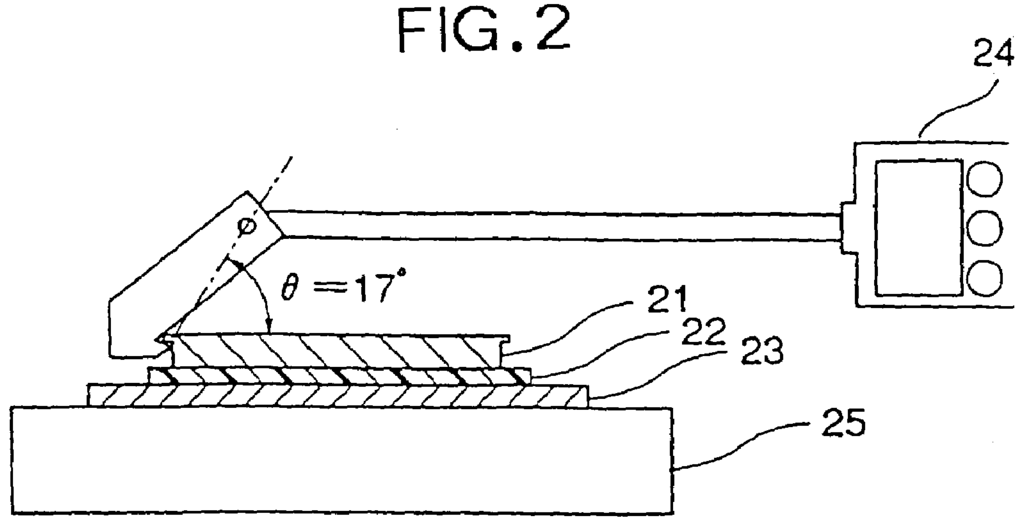
FIG. 2 is a front elevation used to describe a method for measuring peel strength by using a push-pull gauge.
Figure 3:
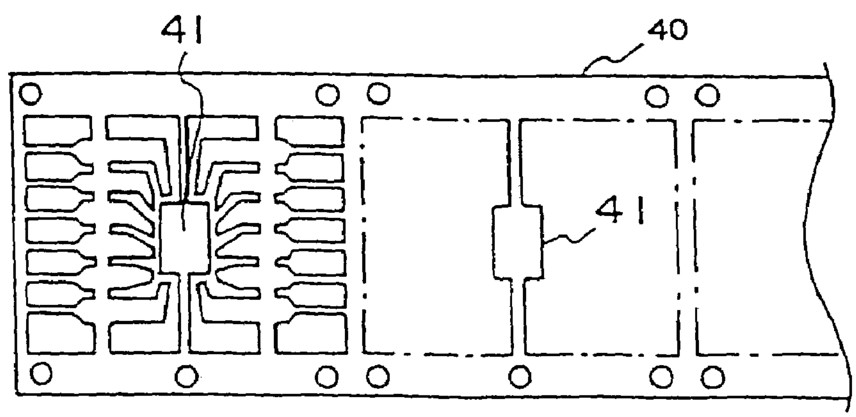
FIG. 3 is a plan view of an example of lead frames having a die pads.

On a support member, such as a tab surface of a lead frame, for supporting semiconductor chips, a silicone chip (test piece) of 5×5 mm was attached by laying a filmy organic die-bonding materials therebetween. The chip-attached support member was held on a heating platen heated at a temperature of 240° C. for 20 seconds. As shown in FIG. 2, a peel strength was measured by a push-pull gauge at a test speed of 0.5 mm/minute. In FIG. 2, reference numeral 21 represents a semiconductor chip, 22 represents a filmy organic die-bonding material, 23 represents a lead frame, 24 represents the push-pull gauge, 25 represents the heating platen. In this case, the test piece was held at a temperature of 240° C. for 20 seconds, but in a case where a semiconductor device is packaged at a different temperature depending on its purpose, the measurement must be performed at the temperature.

EXAMPLE 6

To 100 g of polyimide E and 10 g of epoxy resin, 280 g of an organic solvent was added to make a solution. To the solution obtained, silver powder was added in a stated amount, followed by thorough stirring so as to be homogeneously dispersed, to obtain a coating varnish.

This coating varnish was coated on a carrier film (OPP film; biaxially stretched polypropylene), followed by drying in a dryer with internal air circulation to cause the solvent to evaporate and dry the varnish. Thus, filmy organic die-bonding materials were prepared.

The filmy organic die-bonding materials, having the size as shown in Table 6, were each stuck onto the tab of the lead frame while heating at 160° C. On the lead frame to which the filmy organic die-bonding material was thus stuck, a semiconductor chip was mounted by die bonding carried out under conditions of a temperature of 300° C., a pressure of 12.5 gf/mm$^2$ and a bonding time of 5 seconds, followed by wire bonding and then molding with an encapsulant material (trade name CEL-9000, available from Hitachi Chemical Co., Ltd.). Thus, a semiconductor device was fabricated (QFP package: 14×20×1.4 mm; chip size: 8×10 mm; 42 alloy lead frame).

The semiconductor device having been thus encapsulated was treated in a thermo-hygrostat of 85° C. and 85% RH for 168 hours, and thereafter heated at 240° C. for 10 seconds in an IR reflow furnace.

Thereafter, the semiconductor device was molded with polyester resin, and then cut with a diamond cutter to observe its cross section on a microscope. Rate (%) of occurrence of reflow cracks was measured according to the following expression to make evaluation on the reflow crack resistance.

(Number of occurrence of reflow cracks/number of tests)×100=rate (%) of occurrence of reflow cracks.

The results of evaluation are shown in Table 6.

TABLE 6

| No. | Film size (mm) | Planar dimension of film (mm$^2$) | Chips size (mm) | Planar dimension of chip | Outward protrusion | Rate of occurrence of reflow cracks (%) |
|---|---|---|---|---|---|---|
| 1 | 11 × 13 | 143 | 8 × 10 | 80 | Yes | 100 |
| 2 | 10 × 12 | 123 | 8 × 10 | 80 | Yes | 100 |
| 3 | 9 × 11 | 99 | 8 × 10 | 80 | Yes | 100 |
| 4 | 9 × 10 | 90 | 8 × 10 | 80 | Yes | 70 |
| 5 | 8 × 11 | 88 | 8 × 10 | 80 | Yes | 60 |
| 6 | 8 × 10 | 80 | 8 × 10 | 80 | No | 0 |
| 7 | 8 × 9 | 72 | 8 × 10 | 80 | No | 0 |
| 8 | 7 × 10 | 70 | 8 × 10 | 80 | No | 0 |
| 9 | 8 × 9 | 72 | 8 × 10 | 80 | No | 0 |
| 10 | 6 × 8 | 48 | 8 × 10 | 80 | No | 0 |
| 11 | 5 × 7 | 35 | 8 × 10 | 80 | No | 0 |
| 12 | 4 × 6 | 24 | 8 × 10 | 80 | No | 0 |

TABLE 6-continued

| No. | Film size (mm) | Planar dimension of film (mm$^2$) | Chips size (mm) | Planar dimension of chip | Outward protrusion | Rate of occurrence of reflow cracks (%) |
|---|---|---|---|---|---|---|
| 13 | 3 × 5 | 15 | 8 × 10 | 80 | No | 0 |
| 14 | 2 × 4 | 8 | 8 × 10 | 80 | No | 0 |

EXAMPLE 7

To 100 g of polyimide F and 10 g of epoxy resin, 280 g of an organic solvent was added to make a solution. To the solution obtained, silver powder was added in a stated amount, followed by thorough stirring so as to be homogeneously dispersed, to obtain a coating varnish.

This coating varnish was coated on a carrier film (OPP film; biaxially stretched polypropylene), followed by drying in a dryer with internal air circulation to cause the solvent to evaporate and dry the varnish. Thus, filmy organic die-bonding materials were prepared.

The filmy organic die-bonding materials, having the modulus of elasticity at a temperature of 250° C. as shown in Table 7, were each stuck onto the tab of the lead frame while heating at 160° C. On the lead frame to which the filmy organic die-bonding material was thus stuck, a semiconductor chip was mounted by die bonding carried out under conditions shown in Table 7.

TABLE 7

| | Composition of film | | Film modulus of elastic | Conditions | | |
|---|---|---|---|---|---|---|
| No. | Polyimide | Ag content (wt. %) | (MPa) | Temperature (° C.) | Pressure (gf/mm$^2$) | Peel strength (Kgf/5 × 5 mm chip) |
| 1 | Polyimide F | 60 | 0.2 | 230 | 2.0 | >2.0 |
| 2 | Polyimide F | 40 | 0.3 | 230 | 2.0 | >2.0 |
| 3 | Polyimide F | 0 | 0.4 | 230 | 2.0 | 0.8 |

Method of Measuring a Film Modulus of Elasticity (MPa)

By using RHEOLOGRAPH OF SOLID S type, available from Kabushiki Kaisha Toyoseiki Seisakusho, a dynamic viscoelasticity was measured at a heating speed of 5° C./minute and a frequency of 10 Hz. A storage modulus E' at a temperature of 250° C. was regarded as the modulus of elasticity.

Method of Measuring a Peel Strength

It is as same as that of Example 5.

What is calimed is:

1. A single-layer organic die-bonding film having the property of bonding a semiconductor chip to a support member under conditions of 100–230° C. temperature and pressure of 0.1–30 gf/mm$^2$, and having a modulus of elasticity of 10 MPa or less at a temperature of 250° C. and a peel strength of 0.5 Kgf/5×5 mm chip or above at a stage where the semiconductor chip has been bonded to the support member, wherein the single-layer die-bonding film comprises one or more resins selected from the group consisting of silicone resin, acrylic resin, polvimide resin and epoxy resin.

2. A single-layer organic die-bonding film as in claim 1, having a residual volatile component in an amount of not more than 3.0% by weight.

3. A single-layer organic die-bonding film as in claim 2, having water absorption of 1.5% by volume or less.

4. A single-layer organic die-bonding film as in claim 3, and having a saturation moisture absorption of 1.0% by volume or less.

5. A single-layer organic die-bonding film as in claim 1, having water absorption of 1.5% by volume or less.

6. A single-layer organic die-bonding film as in claim 1, and having a saturation moisture absorption of 1.0% by volume or less.

7. A single-layer organic die-bonding film as in claim 1, comprising one or more epoxy resins selected from the group consisting of glycidyl ether epoxy, glycidylamine epoxy, glycidyl ester epoxy and alicyclic epoxy.

8. An organic die-bonding film having the property of bonding a semiconductor chip to a support member under conditions of 100–230° C. temperature and pressure of 1–30 gf/mm2, and having water absorption of 1.5% by volume or less, and having a residual volatile component in an amount of not more than 3.0% by weight and a peel strength of 0.5 Kgf/5×5 mm chip or above at a stage where the semiconductor chip has been bonded to the support member, wherein the organic die-bonding film comprises one or more resins selected from the group consisting of silicone resin, acrylic resin, polymide resin and epoxy resin.

9. An organic die-bonding film as in claim 8, having a modulus of elasticity of 10 MPa or less at a temperature of 250° C.

10. An organic die-bonding film as in claim 9 and having a saturation moisture absorption of 1.0% by volume or less.

11. An organic die-bonding film as in claim 8 and having a saturation moisture absorption of 1.0% by volume or less.

12. An organic die-bonding film as in claim 8 comprising one or more epoxy resins selected from the group consisting of glycidyl ether epoxy, glycidylamine epoxy, glycidyl ester epoxy and alicyclic epoxy.

13. A semiconductor device comprising:

a semiconductor chip;

a support member;

a die-bonding film according to one of claims 2-4,5,6,7-10,11 or 12 bonding the semiconductor chip to the support member; and an encapsulating resin encapsulating the semiconductor chip, die-bonding film and support member.

* * * * *